United States Patent [19]
Fujii et al.

[11] Patent Number: 5,619,146
[45] Date of Patent: Apr. 8, 1997

[54] SWITCHING SPEED FLUCTUATION DETECTING APPARATUS FOR LOGIC CIRCUIT ARRANGEMENT

[75] Inventors: Masahiro Fujii; Yasuo Ohno; Tadashi Maeda; Takao Atsumo; Noriaki Matsuno; Keiichi Numata; Nobuhide Yoshida, all of Tokyo, Japan

[73] Assignee: NEC Corporation, Tokyo, Japan

[21] Appl. No.: 604,621

[22] Filed: Feb. 21, 1996

[30] Foreign Application Priority Data

Feb. 21, 1995 [JP] Japan ................................. 7-56695

[51] Int. Cl.⁶ .................................................. H03K 17/14
[52] U.S. Cl. ................................... 326/21; 326/93
[58] Field of Search ....................... 326/9, 21, 27, 326/31, 93, 98; 327/336, 344

[56] References Cited

U.S. PATENT DOCUMENTS 5,134,311  7/1992  Biber et al. ........................ 326/82 X
5,166,555  11/1992  Kano ................................. 326/87 X
5,241,221  8/1993  Fletcher et al. ................... 326/27 X
5,268,868  12/1993  Kajigaya et al. .................. 326/27 X

FOREIGN PATENT DOCUMENTS 63-302616  12/1988  Japan .

OTHER PUBLICATIONS

T. Kobayashi et al., "Self–Adjusting Threshold–Voltage Scheme (SATS) for Low–Voltage High–Speed Operation", *IEEE 1994 Custom Integrated Circuits Conference*, pp. 271–274, 1994.

Primary Examiner—David R. Hudspeth
Attorney, Agent, or Firm—Sughrue, Mion, Zinn, Macpeak & Seas

[57] ABSTRACT

In a switching speed fluctuation detecting apparatus, an input terminal for receiving a signal having a definite time period, a series arrangement of at least one first logic circuit connected to the input terminal, a second logic circuit having a first input connected to the input terminal and a second input connected to an output of the series arrangement and an integrator connected to an output of the second logic circuit are provided.

10 Claims, 14 Drawing Sheets

Fig. 6D $V_{out}$

Fig. 7

Fig. 8A Vin
Fig. 8B Vin'
Fig. 8C Vo
Fig. 8D Vout

Fig. 9

Fig. 10A  Vin
Fig. 10B  Vin'
Fig. 10C  Vo
Fig. 10D  Vout

Fig. 12D $V_{out}$

Fig. 13

Fig. 14A  $V_{in}$
Fig. 14B  $V_{in}'$
Fig. 14C  $V_o$
Fig. 14D  $V_{out}$

Fig. 15

Fig. 16A $V_{in}$
Fig. 16B $V_{in}'$
Fig. 16C $V_o$
Fig. 16D $V_{out}$

Fig. 17

Fig. 18A  $V_{in}$
Fig. 18B  $V_{in}'$
Fig. 18C  $V_o$
Fig. 18D  $V_{out}$

Fig. 19

Fig. 20A $V_{in}$
Fig. 20B $V_{in}'$
Fig. 20C $V_o$
Fig. 20D $V_{out}$

Fig. 22D $V_{out}$

Fig. 24D $V_{out}$

Fig. 25

Fig. 26A $V_{in}$
Fig. 26B $V_{in}'$
Fig. 26C $V_o$
Fig. 26D $V_{out}$

SWITCHING SPEED FLUCTUATION DETECTING APPARATUS FOR LOGIC CIRCUIT ARRANGEMENT

BACKGROUND OF THE INVENTION

1. Field of the Invention

The present invention relates to an apparatus capable of directly detecting fluctuations of switching speed of a logic circuit arrangement in a digital integrated apparatus.

2. Description of the Related Art

As digital integrated circuits have become more reduced in size, a lower power supply voltage has been adopted to alleviate an electric field applied to elements, thus improving the reliability of the elements. Even under a lower power supply voltage, in order to ensure a stable circuit operation, fluctuations in circuit characteristics due to temperature fluctuations, power supply voltage fluctuations, and processing fluctuations must be compensated for.

A prior art apparatus for detecting fluctuations of circuit characteristics includes an N-channel enhancement-type MOS transistor and a resistor in series arranged between a ground voltage terminal and a power supply terminal. In this case, the resistance value of the resistor is so large that a voltage at a connection between the transistor and the resistor is approximately equal to the threshold voltage of the transistor. Therefore, a back gate voltage of a plurality of transistors can be controlled by this voltage, or the size of a plurality of transistors connected in parallel can be quasi-changed by this voltage, thus compensating for the fluctuations of circuit characteristics due to temperature fluctuations, power supply voltage fluctuations and processing fluctuations. This will be explained later in detail.

In the above-described prior art apparatus, however, although the fluctuations of circuit characteristics is detected, fluctuations of switching speed cannot be detected, and thus, it is impossible to compensate for the fluctuations of switching speed.

SUMMARY OF THE INVENTION

It is an object of the present invention to provide an apparatus capable of directly detecting fluctuations of switching speed in a digital integrated apparatus.

According to the present invention, in a switching speed fluctuation detecting apparatus, an input terminal for receiving a signal having a definite time period, a series arrangement of at least one first logic circuit connected to the input terminal, a second logic circuit having a first input connected to the input terminal and a second input connected to an output of the series arrangement, and an integrator connected to an output of the second logic circuit are provided.

In the second logic circuit, a logic operation between the signal at the input terminal and the output signal of the series arrangement is carried out, and as a result, a pulse width of the output signal of the second logic circuit has a linear relationship to a delay time of the series arrangement. Therefore, the output signal of the second logic circuit is integrated by the integrator, and as a result, the DC voltage output of the integrator has a linear relationship to the delay time of the series arrangement.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, a prior art circuit characteristic detecting apparatus will be explained with reference to FIG. 1.

Figure 1:
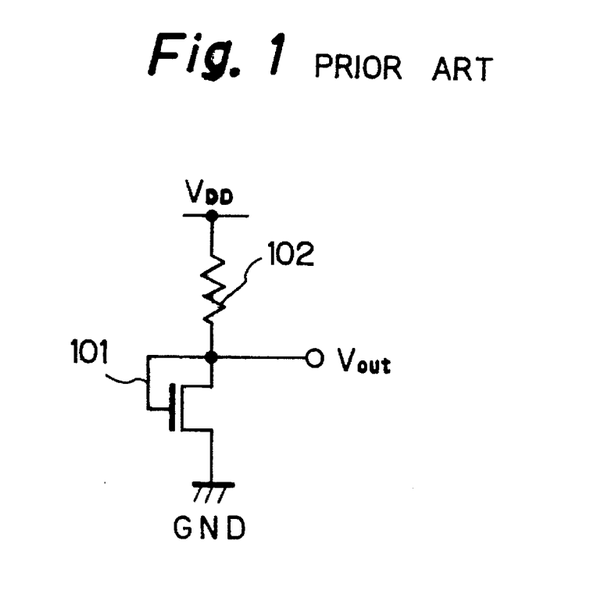
FIG. 1 is a circuit diagram illustrating a prior art circuit characteristic detecting apparatus.

In FIG. 1, an N-channel enhancement-type MOS transistor 101 and a resistor 102 are connected in series between a ground voltage terminal GND and a power supply terminal $V_{DD}$. In this case, a drain of the transistor 101 is connected to a gate thereof. Therefore, when the resistance value of the resistor 102 is made very large, an output voltage $V_{out}$ is approximately equal to the threshold voltage of the transistor 101, thus detecting this threshold voltage. Therefore, a back gate voltage of transistors can be controlled by the output voltage $V_{out}$, or the size of a plurality of transistors connected in parallel can be quasi-changed by the output voltage $V_{out}$, thus compensating for the fluctuations of circuit characteristics due to temperature fluctuations, power supply voltage fluctuations and processing fluctuations. Also, fluctuations of an ON current of the transistor 101 can be detected in accordance with the resistance value of the resistor 102.

In the apparatus of FIG. 1, however, fluctuations of switching speed cannot be detected.

Figure 2:
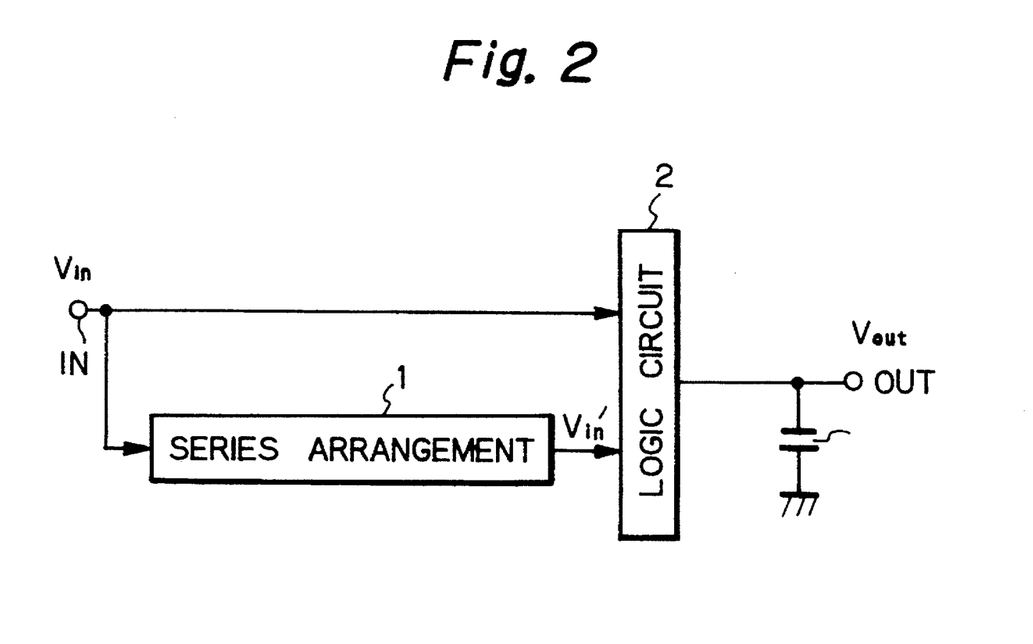
FIG. 2 is a circuit diagram illustrating an embodiment of the switching speed fluctuation detecting appartus according to the present invention.

In FIG. 2, which illustrates an embodiment of the switching speed fluctuation detecting apparatus according to the present invention, this apparatus is provided in a digital integrated circuit. In FIG. 2, an input signal $V_{in}$, having a definite time period is supplied to a series arrangement 1 serving as a delay circuit, and simultaneously, the input signal $V_{in}$ is supplied directly to a logic circuit 2. In the logic circuit 2, a logic operation is performed upon the input signal $V_{in}$ and a signal $V_{in}'$ delayed by the series arrangement 1, and as a result, a pulse width of the output signal of the logic circuit 2 has a linear relationship to a delay time of the series arrangement 1. The output signal of the logic circuit 2 is supplied to an integrator 3 formed by a capacitor, and as a result, a DC voltage output $V_{out}$ of the integrator 3 has a linear relationship to the delay time of the series arrangement 1.

Hereinafter, examples of the series arrangement 1 and the logic circuit 2 are explained.

Figure 3:
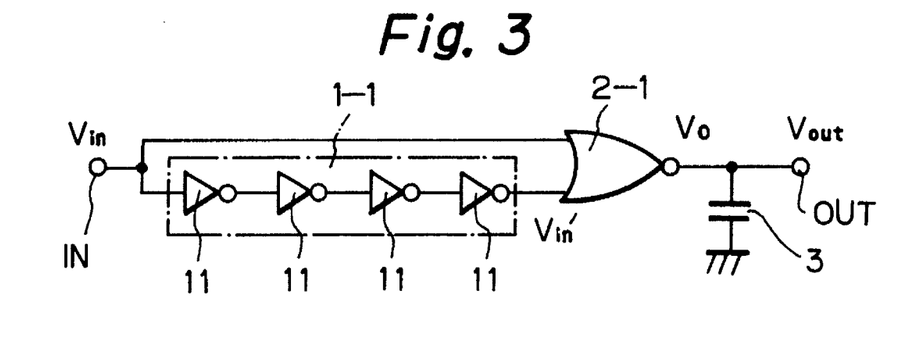
FIG. 3 is a detailed circuit diagram of a first example of the apparatus of FIG. 2.

In FIG. 3, which illustrates a first example of the circuit of FIG. 2, a series arrangement 1-1 is formed by four inverters 11, and a logic circuit 2-1 is formed by a NOR circuit.

Figure 4A:
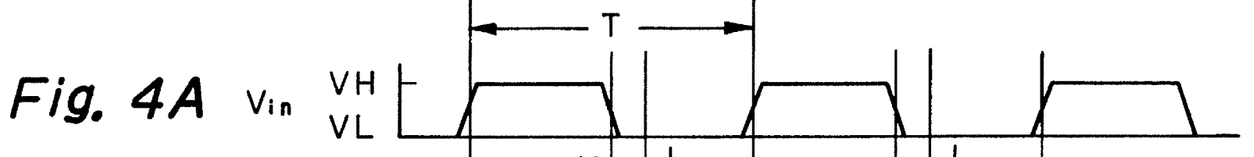
FIGS. 4A through 4D are timing diagrams for explaining the operation of the apparatus of FIG. 3.
Figure 4B:
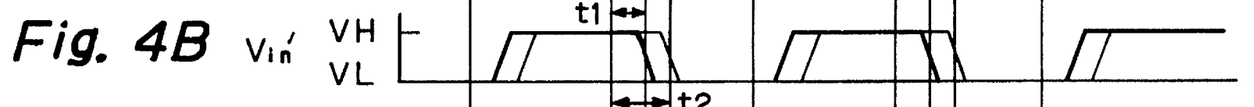
Figure 4C:
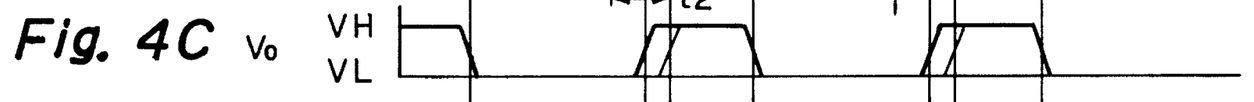
Figure 4D:
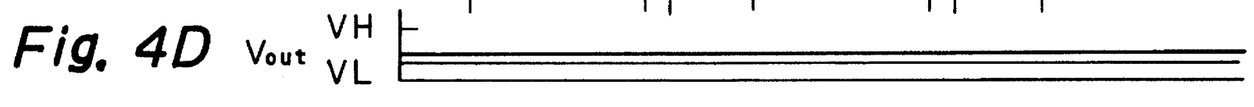

The operation of the apparatus of FIG. 3 is explained next with reference to FIGS. 4A through 4D. As shown in FIGS. 4A and 4B, the signal $V_{in}'$ passed through the series arrangement 1 is delayed by a time period t1 or t2 as compared with the input signal $V_{in}$. The delay time is dependent upon the series arrangement 1-1. In this case, in the logic circuit 2-1, only when the signals $V_{in}$ and $V_{in}'$ are both low, is the output signal $V_o$ of the logic circuit 2-1 high as shown in FIG. 4C. Otherwise, the output signal $V_o$ is low. Therefore, a pulse width of the output signal $V_o$ under the condition that the integrator 3 is not provided depends upon the delay time of the series arrangement 1-1. For example, if the delay time is increased from t1 to t2, the pulse width of the output signal $V_o$ as shown in FIG. 4C is decreased. Here, assume that the time period of the input signal $V_{in}$ is T and a duty ratio of the input signal $V_{in}$ is 50%. Then, the pulse width of the output signal $V_o$ of FIG. 4C is $$T/2 - t \quad (1)$$

where t is the delay time of the series arrangement 1-1. Therefore, when the output signal $V_o$ as shown in FIG. 4C is integrated by the integrator 3, the DC voltage output $V_{out}$ of the integrator 3 is $$(VH+VL)/2 - (VH-VL) \cdot t/T \quad (2)$$

where VH is a high level voltage, and VL is a low level voltage. Thus, the DC voltage output $V_{out}$ of the integrator 3 has a linear relationship to the delay time t of the series arrangement 1-1.

Figure 5:
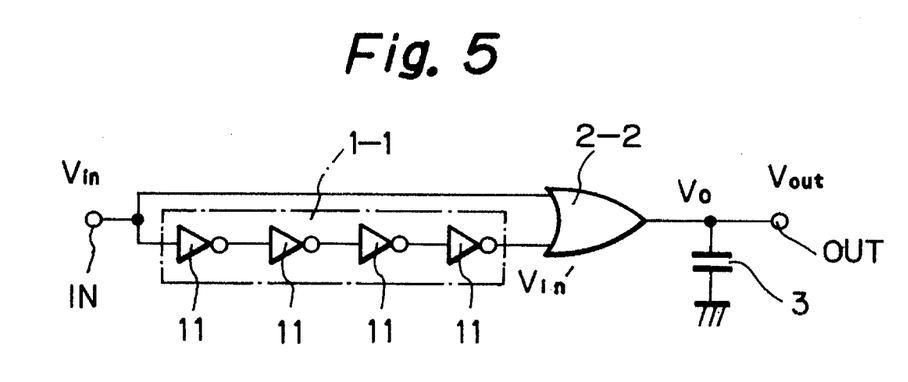
FIG. 5 is a detailed circuit diagram of a second example of the apparatus of FIG. 2.

In FIG. 5, which illustrates a second example of the circuit of FIG. 2, a logic circuit 2-2 is formed by an OR circuit, which is different from the circuit of FIG. 3.

Figures 6A, 6B, 6C:
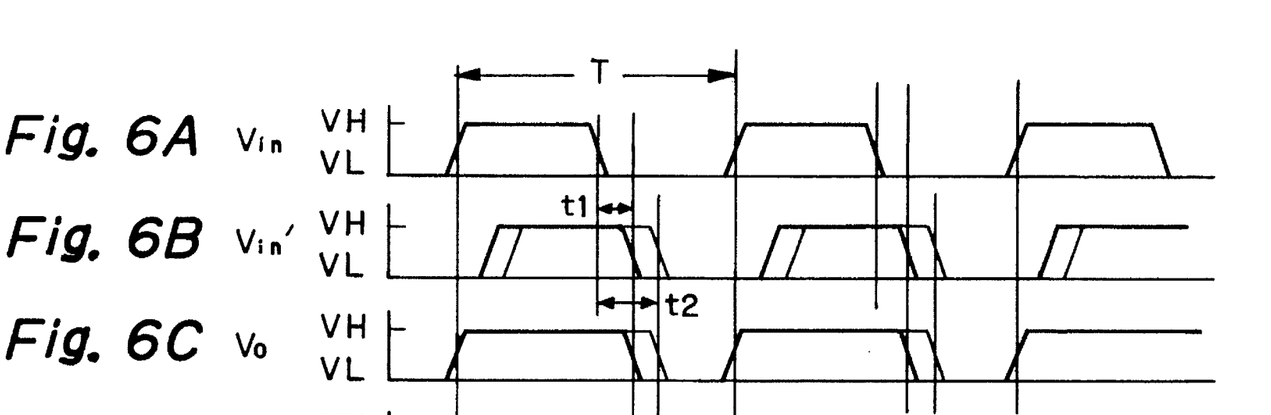
FIGS. 6A through 6D are timing diagrams for explaining the operation of the apparatus of FIG. 5.
Figure 6D:
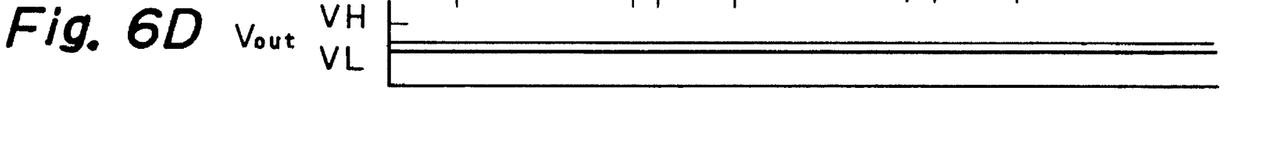

The operation of the apparatus of FIG. 5 is explained next with reference to FIGS. 6A through 6D. In this case, in the logic circuit 2-2, only when the signals $V_{in}$ and $V_{in}'$ as shown in FIGS. 6A and 6B are both low, is the output signal $V_o$ of the logic circuit 2-2 low as shown in FIG. 6C. Otherwise, the output signal $V_o$ is high. Therefore, a pulse width of the output signal $V_o$ under the condition that the integrator 3 is not provided depends upon the delay time of the series arrangement 1-1. For example, if the delay time is increased from t1 to t2, the pulse width of the output signal $V_o$ as shown in FIG. 6C is increased. Here, assume that the time period of the input signal $V_{in}$ is T and a duty ratio of the input signal $V_{in}$ is 50%. Then, the pulse width of the output signal $V_o$ of FIG. 6C is $$T/2 + t \quad (3)$$

Therefore, when the output signal $V_o$ as shown in FIG. 6C is integrated by the integrator 3, the DC voltage output $V_{out}$ of the integrator 3 is $$(VH+VL)/2 + (VH-VL) \cdot t/T \quad (4)$$

Thus, also in this case, the DC voltage output $V_{out}$ of the integrator 3 has a linear relationship to the delay time t of the series arrangement 1-1.

Figure 7:
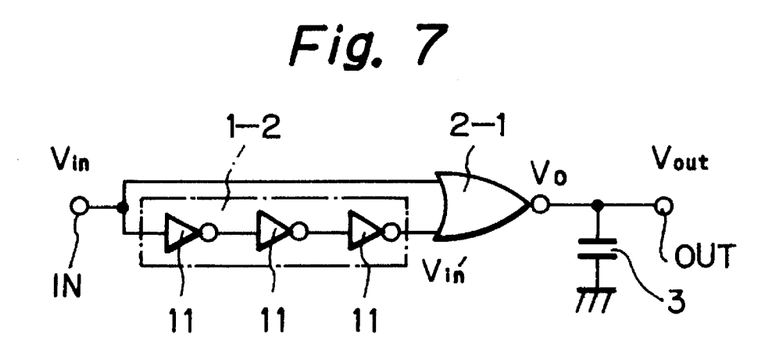
FIG. 7 is a detailed circuit diagram of a third example of the apparatus of FIG. 2.

In FIG. 7, which illustrates a third example of the circuit of FIG. 2, a series arrangement 1-2 is formed by three inverters, which is different from the circuit of FIG. 3.

Figures 8A, 8B, 8C:
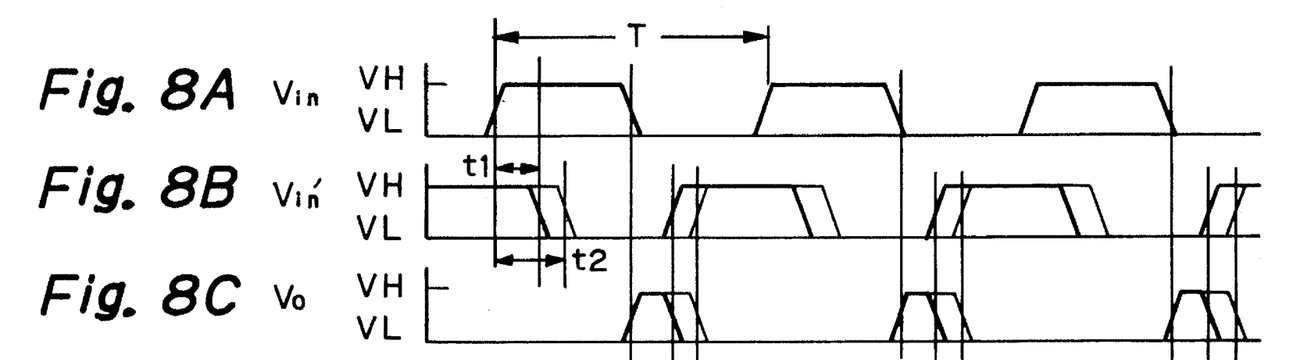
FIGS. 8A through 8D are timing diagrams for explaining the operation of the apparatus of FIG. 7.
Figure 8D:
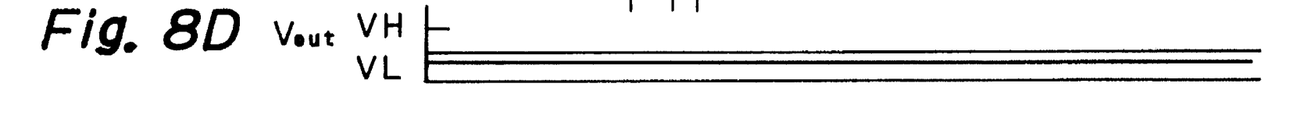

The operation of the apparatus of FIG. 7 is explained next with reference to FIGS. 8A through 8D. In this case, in the logic circuit 2-1, only when the signals $V_{in}$ and $V_{in}'$ as shown in FIGS. 8A and 8B are both low, is the output signal $V_o$ of the logic circuit 2-1 high as shown in FIG. 8C. Otherwise, the output signal $V_o$ is low. Therefore, a pulse width of the output signal $V_o$ under the condition that the integrator 3 is not provided depends upon the delay time of the series arrangement 1-2. For example, if the delay time is increased from t1 to t2, the pulse width of the output signal $V_o$ as shown in FIG. 8C is increased. Here, assume time the time period of the input signal $V_{in}$ is T and a duty ratio of the input signal $V_{in}$ is 50%. Then, the pulse width of the output signal $V_o$ of FIG. 8C is $$t \quad (5)$$

Therefore, when the output signal $V_o$ as shown in FIG. 8C is integrated by the integrator 3, the DC voltage output $V_{out}$ of the integrator 3 is $$VL + (VH-VL) \cdot t/T \quad (6)$$

Thus, also in this case, the DC voltage output $V_{out}$ of the integrator 3 has a linear relationship to the delay time t of the series arrangement 1-2.

Figure 9:
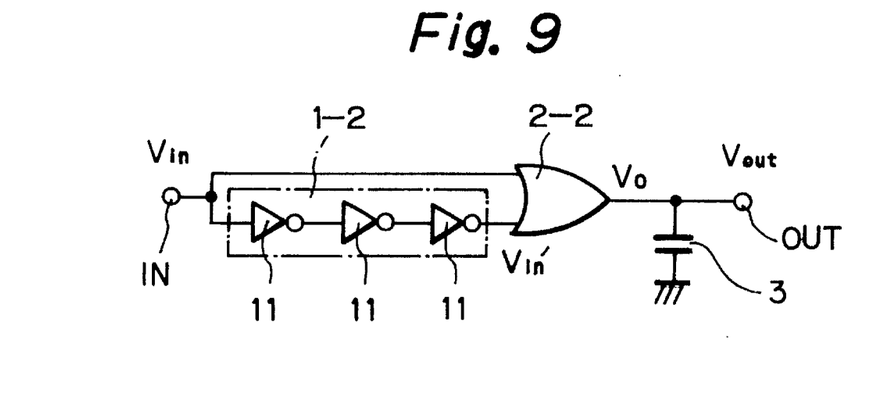
FIG. 9 is a detailed circuit diagram of a fourth example of the apparatus of FIG. 2.

In FIG. 9, which illustrates a fourth example of the circuit of FIG. 2, a logic circuit 2-2 is formed by an OR circuit, which is different from the circuit of FIG. 3.

Figure 10A:
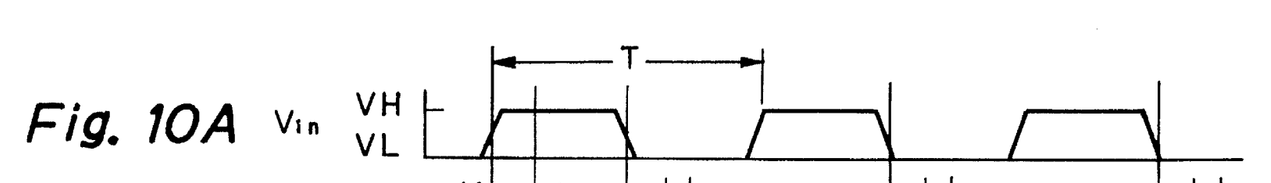
FIGS. 10A through 10D are timing diagrams for explaining the operation of the apparatus of FIG. 9.
Figure 10B:
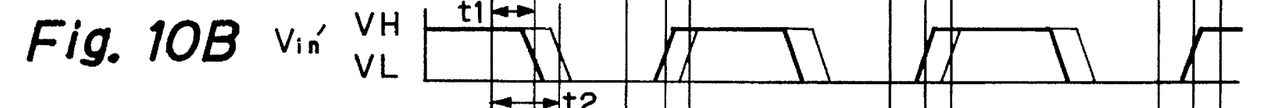
Figure 10C:
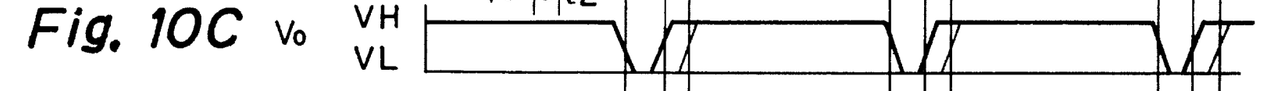
Figure 10D:
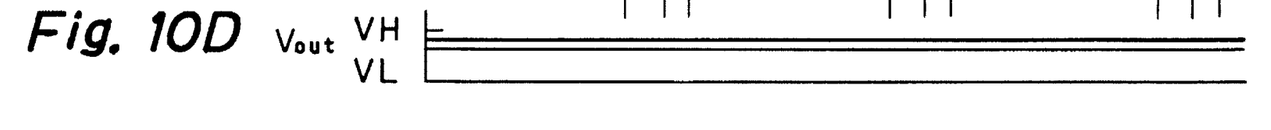

The operation of the apparatus of FIG. 9 is explained next with reference to FIGS. 10A through 10D. In this case, in the logic circuit 2-2, only when the signals $V_{in}$ and $V_{in}'$ as shown in FIGS. 10A and 10B are both low, is the output signal $V_o$ of the logic circuit 2-2 low as shown in FIG. 10C. Otherwise, the output signal $V_o$ is high. Therefore, a pulse width of the output signal $V_o$ under the condition that the integrator 3 is not provided depends upon the delay time of the series arrangement 1-2. For example, if the delay time is increased from t1 to t2, the pulse width of the output signal $V_o$ as shown in FIG. 10C is increased. Here, assume that the time period of the input signal $V_{in}$ is T and a duty ratio of the input signal $V_{in}$ is 50%. Then, the pulse width of the output signal $V_o$ of FIG. 10C is $$T-t \tag{7}$$

Therefore, when the output signal $V_o$ as shown in FIG. 10C is integrated by the integrator 3, the DC voltage output $V_{out}$ of the integrator 3 is $$VH-(VH-VL) \cdot t/T \tag{8}$$

Thus, also in this case, the DC voltage output $V_{out}$ of the integrator 3 has a linear relationship to the delay time t of the series arrangement 1-2.

Figure 11:
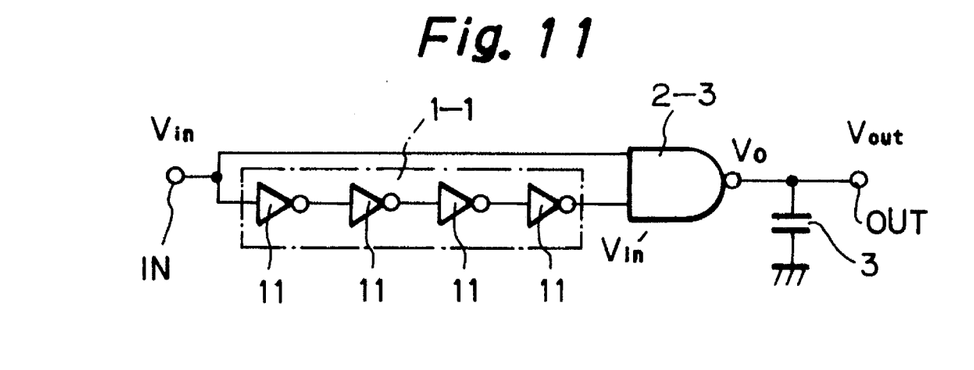
FIG. 11 is a detailed circuit diagram of a seventh example of the apparatus of FIG. 2.

In FIG. 11, which illustrates a fifth example of the circuit of FIG. 2, a logic circuit 2-3 is formed by a NAND circuit, which is different from the circuit of FIG. 3.

Figure 12A:
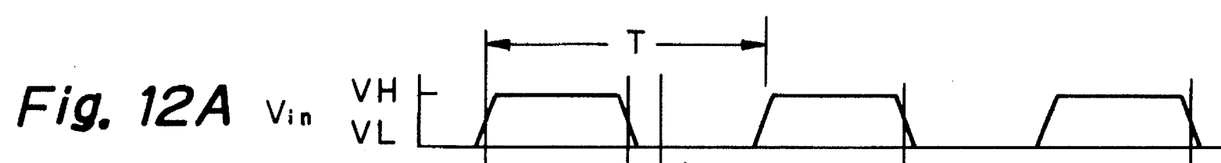
FIGS. 12A through 12D are timing diagrams for explaining the operation of the apparatus of FIG. 11.
Figure 12B:
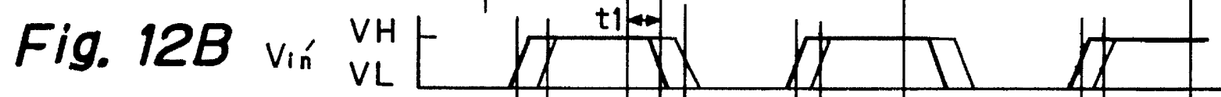
Figure 12C:
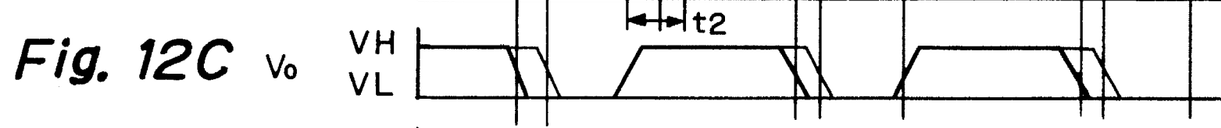
Figure 12D:
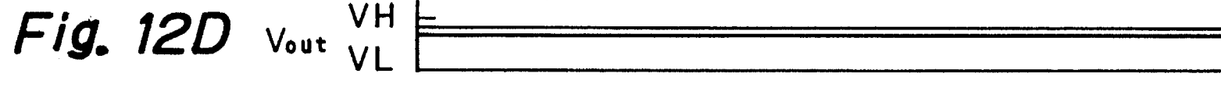

The operation of the apparatus of FIG. 11 is explained next with reference to FIGS. 12A through 12D. In this case, in the logic circuit 2-3, only when the signals $V_{in}$ and $V_{in}'$ as shown in FIGS. 12A and 12B are both high, is the output signal $V_o$ of the logic circuit 2-3 low as shown in FIG. 12C. Otherwise, the output signal $V_o$ is high. Therefore, a pulse width of the output signal $V_o$ under the condition that the integrator 3 is not provided depends upon the delay time of the series arrangement 1-1. For example, if the delay time is increased from t1 to t2, the pulse width of the output signal $V_o$ as shown in FIG. 12C is increased. Here, assume that the time period of the input signal $V_{in}$ is T and a duty ratio of the input signal $V_{in}$ is 50%. Then, the pulse width of the output signal $V_o$ of FIG. 12C is $$T/2+t \tag{9}$$

Therefore, when the output signal $V_o$ as shown in FIG. 12C is integrated by the integrator 3, the DC voltage output $V_{out}$ of the integrator 3 is $$(VH+VL)/2+(VH-VL) \cdot t/T \tag{10}$$

Thus, also in this case, the DC voltage output $V_{out}$ of the integrator 3 bas a linear relationship to the delay time t of the series arrangement 1-1.

Figure 13:
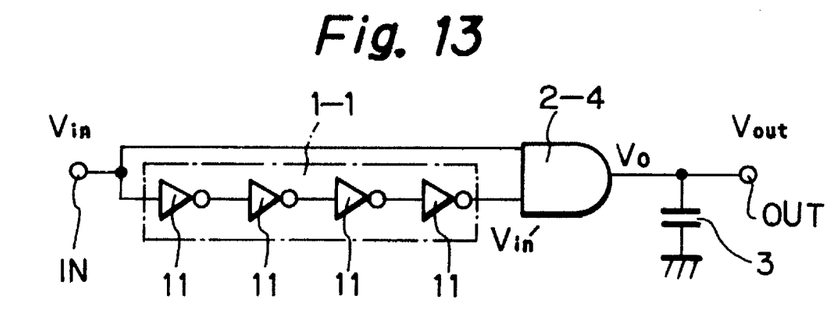
FIG. 13 is a detailed circuit diagram of an eighth example of the apparatus of FIG. 2.

In FIG. 13, which illustrates a sixth example of the circuit of FIG. 2, a logic circuit 2-4 is formed by an AND circuit, which is different from the circuit of FIG. 11.

Figure 14A:
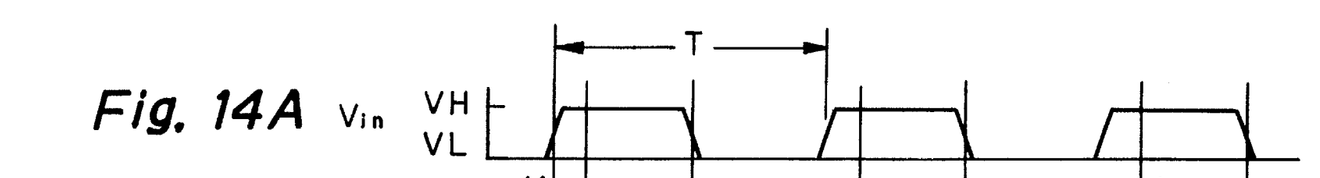
FIGS. 14A through 14D are timing diagrams for explaining the operation of the apparatus of FIG. 13.
Figure 14B:
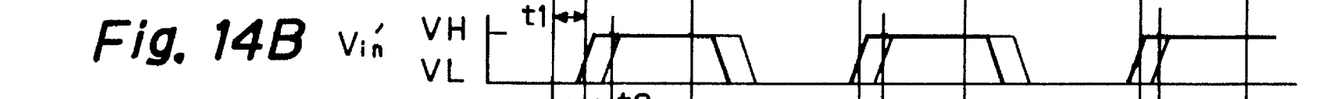
Figure 14C:
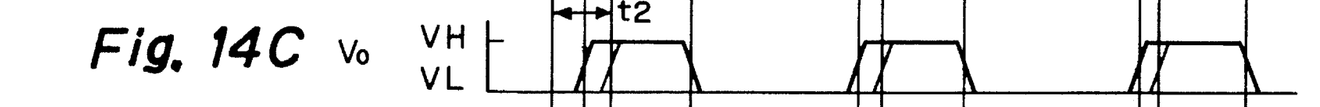
Figure 14D:
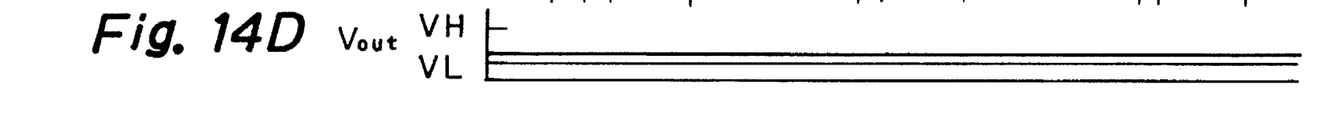

The operation of the apparatus of FIG. 13 is explained next with reference to FIGS. 14A through 14D. In this case, in the logic circuit 2-4, only when the signals $V_{in}$ and $V_{in}'$ as shown in FIGS. 14A and 14B are both high, is the output signal $V_o$ of the logic circuit 2-4 high as shown in FIG. 14C. Otherwise, the output signal $V_o$ is low. Therefore, a pulse width of the output signal $V_o$ under the condition that the integrator 3 is not provided depends upon the delay time of the series arrangement 1-1. For example, if the delay time is increased from t1 to t2, the pulse widthof the output signal $V_o$ as shown in FIG. 14C is decreased. Here, assume that the time period of the input signal $V_{in}$ is T and a duty ratio of the input signal $V_{in}$ is 50%. Then, the pulse width of the output signal $V_o$ of FIG. 14C is $$T/2-t \tag{11}$$

Therefore, when the output signal $V_o$ as shown in FIG. 14C is integrated by the integrator 3, the DC voltage output $V_{out}$ of the integrator 3 is $$(VH+VL)/2-(VH-VL) \cdot t/T \tag{12}$$

Thus, also in this case, the DC voltage output $V_{out}$ of the integrator 3 has a linear relationship to the delay time t of the series arrangement 1-1.

Figure 15:
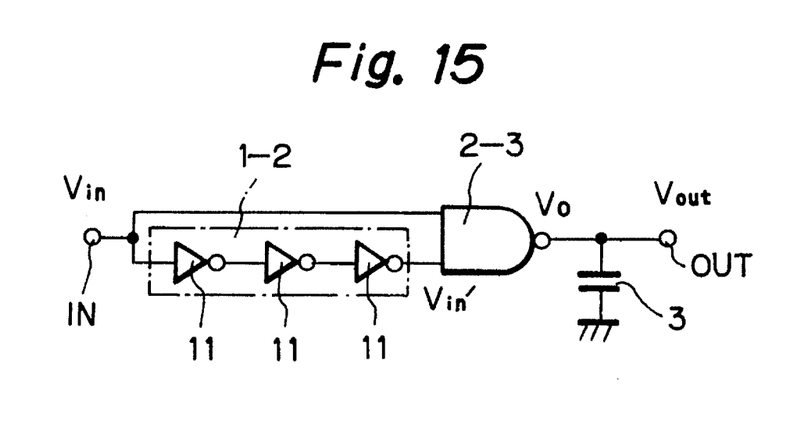
FIG. 15 is a detailed circuit diagram of a fifth example of the apparatus of FIG. 2.

In FIG. 15, which illustrates a seventh example of the circuit of FIG. 2, a series arrangement 1-2 is formed by three inverters, which is different from the circuit of FIG. 11.

Figures 16A, 16B:
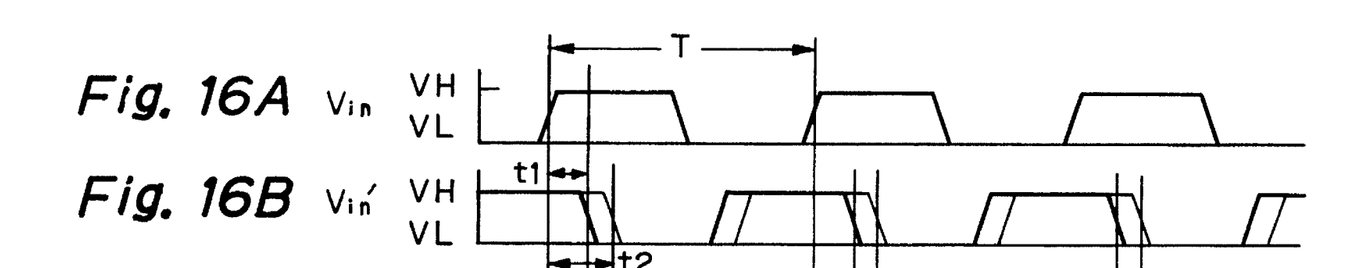
FIGS. 16A through 16D are timing diagrams for explaining the operation of the apparatus of FIG. 15.
Figures 16C, 16D:
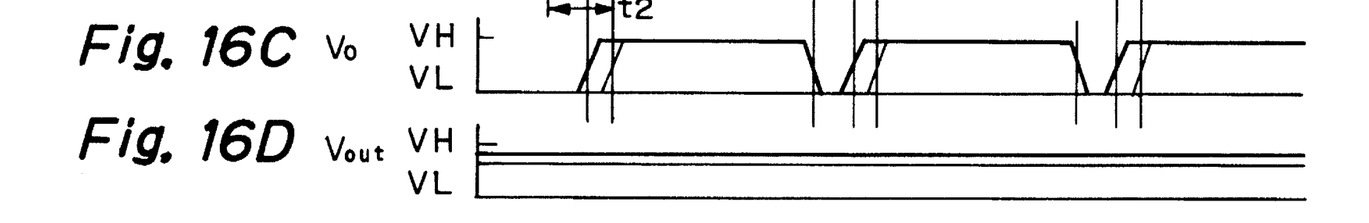

The operation of the apparatus of FIG. 15 is explained next with reference to FIGS. 16A through 16D. In this case, in the logic circuit 2-1, only when the signals $V_{in}$ and $V_{in}'$ as shown in FIGS. 16A and 16B are both high, is the output signal $V_o$ of the logic circuit 2-3 low as shown in FIG. 16C. Otherwise, the output signal $V_o$ is high. Therefore, a pulse width of the output signal $V_o$ under the condition that the integrator 3 is not provided depends upon the delay time of the series arrangement 1-2. For example, if the delay time is increased from t1 to t2, the pulse width of the output signal $V_o$ as shown in FIG. 16C is increased. Here, assume that the time period of the input signal $V_{in}$ is T and a duty ratio of the input signal $V_{in}$ is 50%. Then, the pulse width of the output signal $V_o$ of FIG. 16C is $$T-t \tag{13}$$

Therefore, when the output signal $V_o$ as shown in FIG. 16C is integrated by the integrator 3, the DC voltage output $V_{out}$ of the integrator 3 is $$VH-(VH-VL) \cdot t/T \tag{14}$$

Thus, also in this case, the DC voltage output $V_{out}$ of the integrator 3 has a linear relationship to the delay time t of the series arrangement 1-2.

Figure 17:
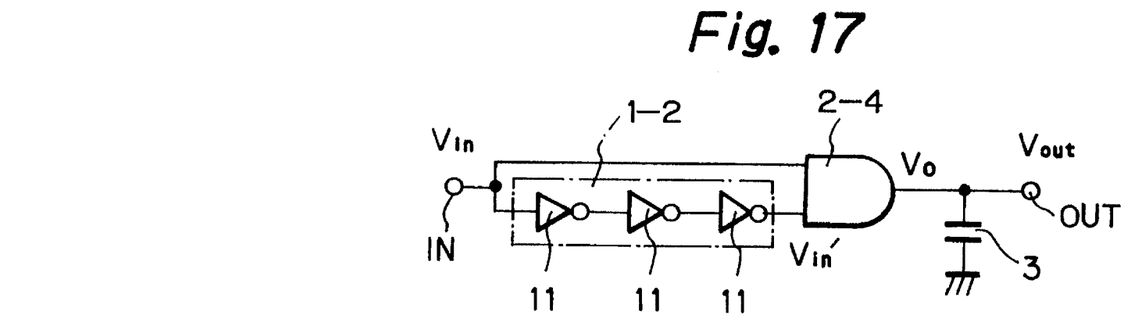
FIG. 17 is a detailed circuit diagram of a sixth example of the apparatus of FIG. 2.

In FIG. 17, which illustrates an eighth example of the circuit of FIG. 2, a logic circuit 2-4 is formed by an AND circuit, which is different from the circuit of FIG. 15.

Figure 18A:
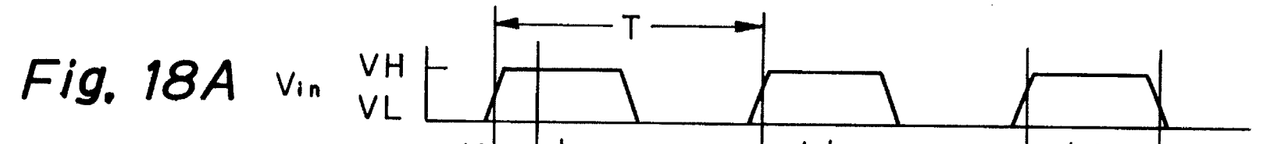
FIGS. 18A through 18D are timing diagrams for explaining the operation of the apparatus of FIG. 17.
Figure 18B:
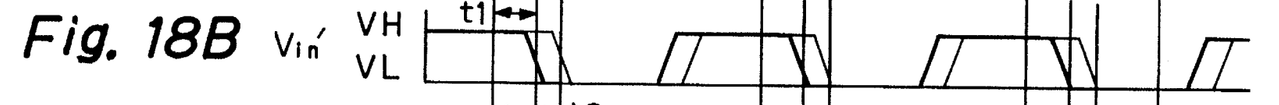
Figure 18C:
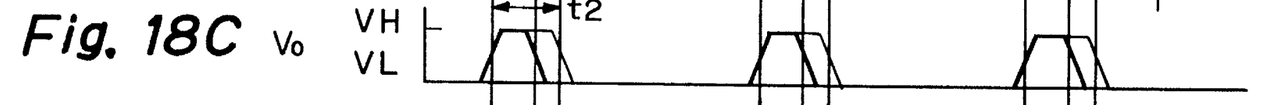
Figure 18D:
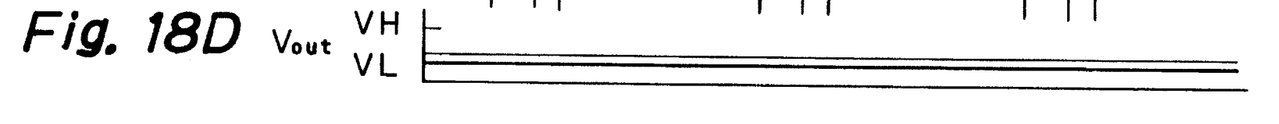

The operation of the apparatus of FIG. 17 is explained next with reference to FIGS. 18A through 18D. In this case, in the logic circuit 2-4, only when the signals $V_{in}$ and $V_{in}'$ as shown in FIGS. 18A and 18B are both high, is the output signal $V_o$ of the logic circuit 2-4 high as shown in FIG. 18C. Otherwise, the output signal $V_o$ is low. Therefore, a pulse width of the output signal $V_o$ under the condition that the integrator 3 is not provided depends upon the delay time of the series arrangement 1-2. For example, if the delay time is increased from t1 to t2, the pulse width of the output signal $V_o$ as shown in FIG. 18C is increased. Here, assume that the time period of the input signal $V_{in}$ is T and a duty ratio of the input signal $V_{in}$ is 50%. Then, the pulse width of the output signal $V_o$ of FIG. 16C is $$t \tag{15}$$

Therefore, when the output signal $V_o$ as shown in FIG. 16C is integrated by the integrator 3, the DC voltage output $V_{out}$ of the integrator 3 is $$VL+(VH-VL) \cdot t/T \tag{16}$$

Thus, also in this case, the DC voltage output $V_{out}$ of the integrator 3 has a linear relationship to the delay time t of the series arrangement 1-2.

Figure 19:
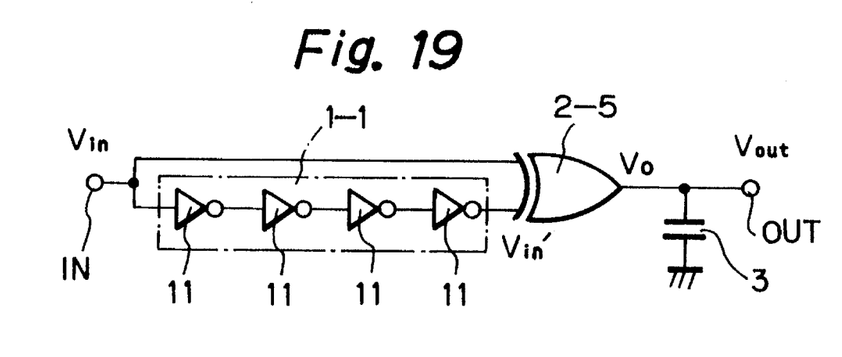
FIG. 19 is a detailed circuit diagram of a ninth example of the apparatus of FIG. 2.

In FIG. 19, which illustrates a ninth example of the circuit of FIG. 2, a logic circuit 2-5 is formed by an exclusive OR circuit, which is different from the circuit of FIG. 3.

Figure 20A:
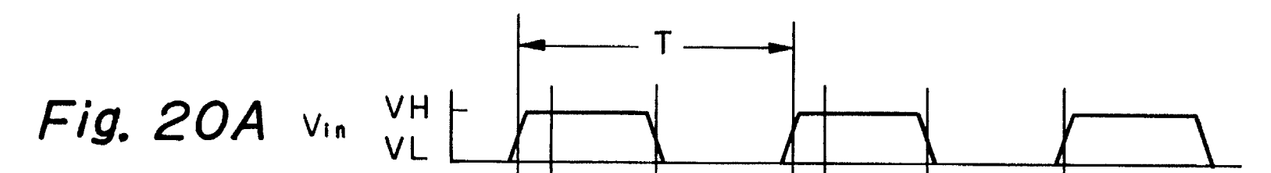
FIGS. 20A through 20D are timing diagrams for explaining the operation of the apparatus of FIG. 19.
Figure 20B:
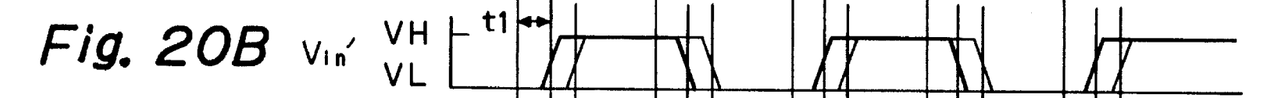
Figure 20C:
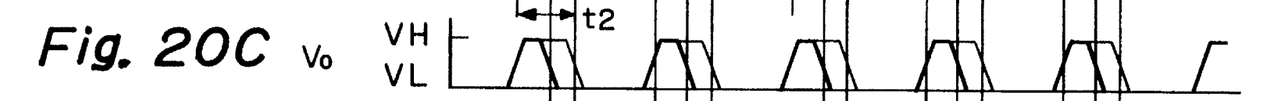
Figure 20D:
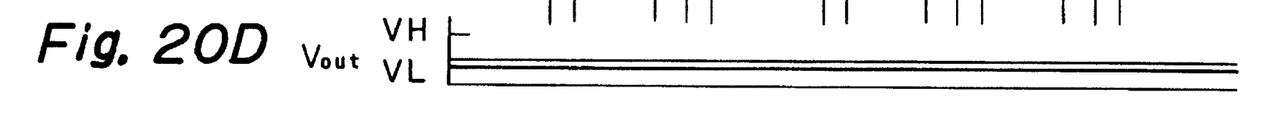

The operation of the apparatus of FIG. 19 is explained next with reference to FIGS. 20A through 20D. In this case, in the logic circuit 2-5, only when the signals $V_{in}$ and $V_{in}'$ as shown in FIGS. 20A and 20B are different from each other, is the output signal $V_o$ of the logic circuit 2-5 high as shown in FIG. 20C. Otherwise, the output signal $V_o$ is low. Therefore, a pulse width of the output signal $V_o$ under the condition that the integrator 3 is not provided depends upon the delay time of the series arrangement 1-1. For example, if the delay time is increased from t1 to t2, the pulse width of the output signal $V_o$ as shown in FIG. 20C is increased. Here, assume that the time period of the input signal $V_{in}$ is T and a duty ratio of the input signal $V_{in}$ is 50%. Then, the pulse width of the output signal $V_o$ of FIG. 20C is $$t \qquad (17)$$

Therefore, when the output signal $V_o$ as shown in FIG. 20C is integrated by the integrator 3, the DC voltage output $V_{out}$ of the integrator 3 is $$VL+(VH-VL)\cdot 2t/T \qquad (18)$$

Thus, also in this case, the DC voltage output $V_{out}$ of the integrator 3 has a linear relationship to the delay time t of the series arrangement 1-1.

Figure 21:
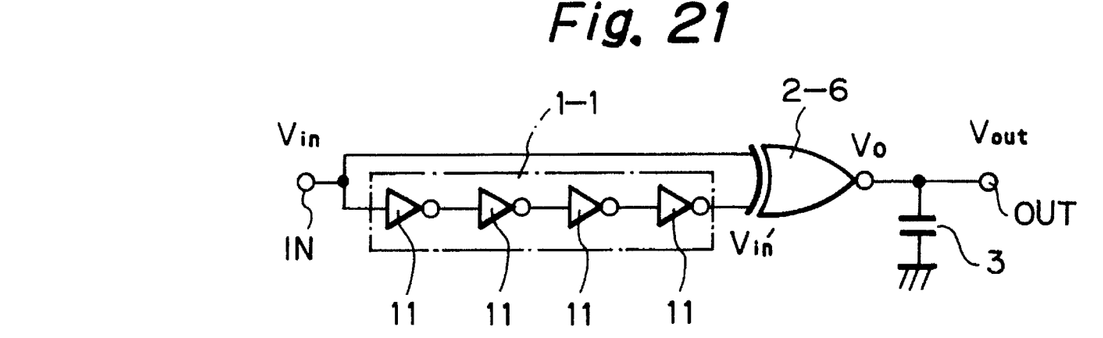
FIG. 21 is a detailed circuit diagram of a tenth example of the apparatus of FIG. 2.

In FIG. 21, which illustrates a tenth example of the circuit of FIG. 2, a logic circuit 2-4 is formed by an exclusive NOR circuit, which is different from the circuit of FIG. 19.

Figure 22A:
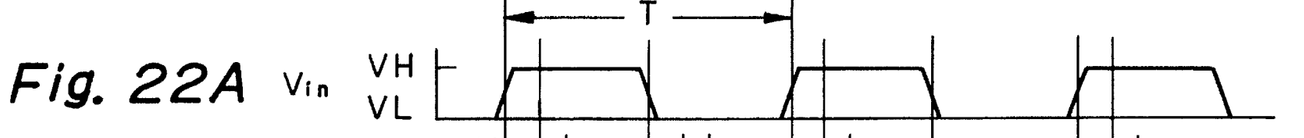
FIGS. 22A through 22D are timing diagrams for explaining the operation of the apparatus of FIG. 21.
Figure 22B:
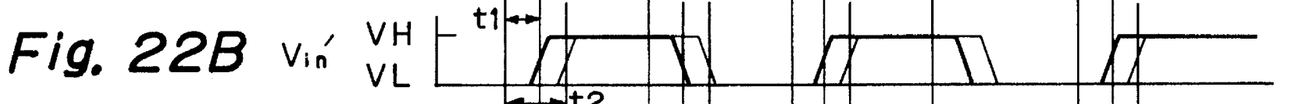
Figure 22C:
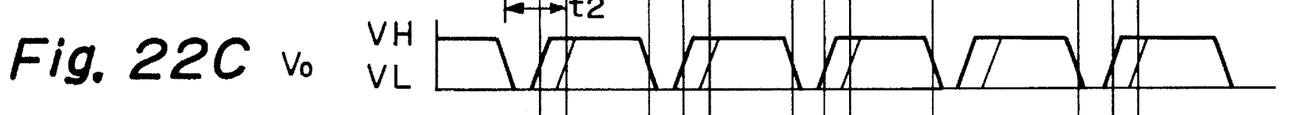
Figure 22D:
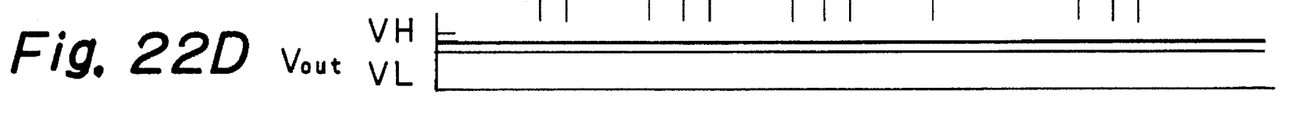

The operation of the apparatus of FIG. 21 is explained next with reference to FIGS. 22A through 22D. In this case, in the logic circuit 2-4, only when the signals $V_{in}$ and $V_{in}'$ as shown in FIGS. 22A and 22B are different from each other, is the output signal $V_o$ of the logic circuit 2-4 high as shown in FIG. 22C. Otherwise, the output signal $V_o$ is low. Therefore, a pulse width of the output signal $V_o$ under the condition that the integrator 3 is not provided depends upon the delay time of the series arrangement 1-1. For example, if the delay time is increased from t1 to t2, the pulse width of the output signal $V_o$ as shown in FIG. 22C is increased. Here, assume that the time period of the input signal $V_{in}$ is T and a duty ratio of the input signal $V_{in}$ is 50%. Then, the pulse width of the output signal $V_o$ of FIG. 22C is $$T/2-t \qquad (19)$$

Therefore, when the output signal $V_o$ as shown in FIG. 22C is integrated by the integrator 3, the DC voltage output $V_{out}$ of the integrator 3 is $$VH-(VH-VL)\cdot 2t/T \qquad (20)$$

Thus, also in this case, the DC voltage output $V_{out}$ of the integrator 3 has a linear relationship to the delay time t of the series arrangement 1-1.

Figure 23:
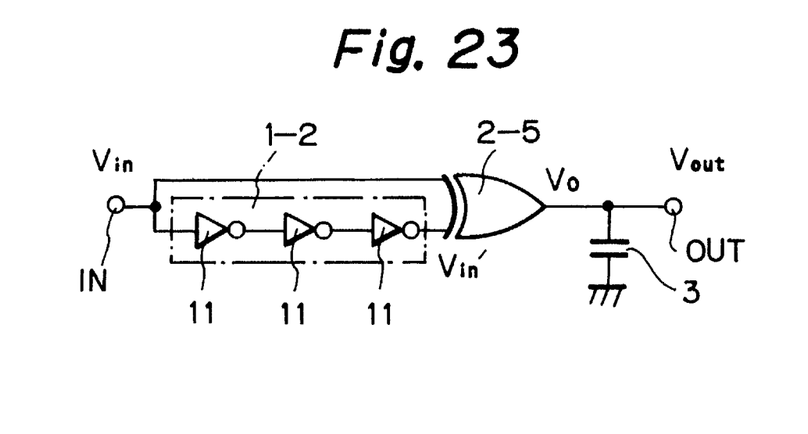
FIG. 23 is a detailed circuit diagram of an eleventh example of the apparatus of FIG. 2.

In FIG. 23, which illustrates an eleventh example of the circuit of FIG. 2, a series arrangement 1-2 is formed by three inverters, which is different from the circuit of FIG. 19.

Figure 24A:
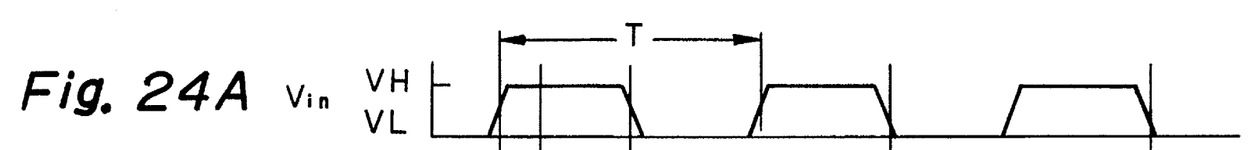
FIGS. 24A through 24D are timing diagrams for explaining the operation of the apparatus of FIG. 23.
Figure 24B:
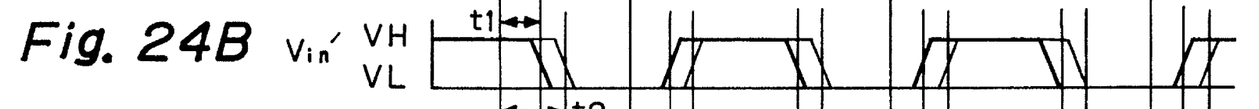
Figure 24C:
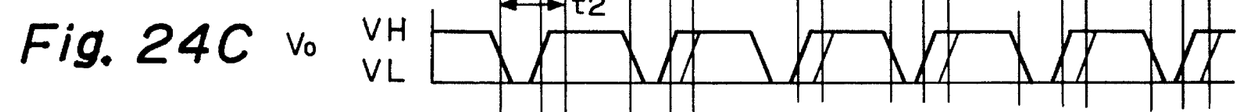
Figure 24D:
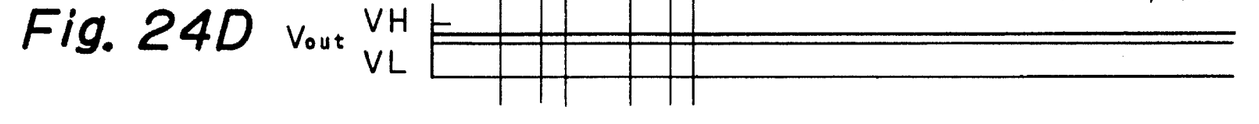

The operation of the apparatus of FIG. 23 is explained next with reference to FIGS. 24A through 24D. In this case, in the logic circuit 2-5, only when the signals $V_{in}$ and $V_{in}'$ as shown in FIGS. 24A and 24B are different from each other, is the output signal Vo of the logic circuit 2-5 high as shown in FIG. 24C. Otherwise, the output signal $V_o$ is low. Therefore, a pulse width of the output signal $V_o$ under the condition that the integrator 3 is not provided depends upon the delay time of the series arrangement 1-2. For example, if the delay time is increased from t1 to t2, the pulse width of the output signal $V_o$ as shown in FIG. 24C is decreased.

Here, assume that the time period of the input signal $V_{in}$ is T and a duty ratio of the input signal $V_{in}$ is 50%. Then, the pulse width of the output signal $V_o$ of FIG. 24C is $$T/2-t \qquad (21)$$

Therefore, when the output signal $V_o$ as shown in FIG. 24C is integrated by the integrator 3, the DC voltage output $V_{out}$ of the integrator 3 is $$VH-(VH-VL)\cdot 2t/T \qquad (22)$$

Thus, also in this case, the DC voltage output $V_{out}$ of the integrator 3 has a linear relationship to the delay time t of the series arrangement 1-2.

Figure 25:
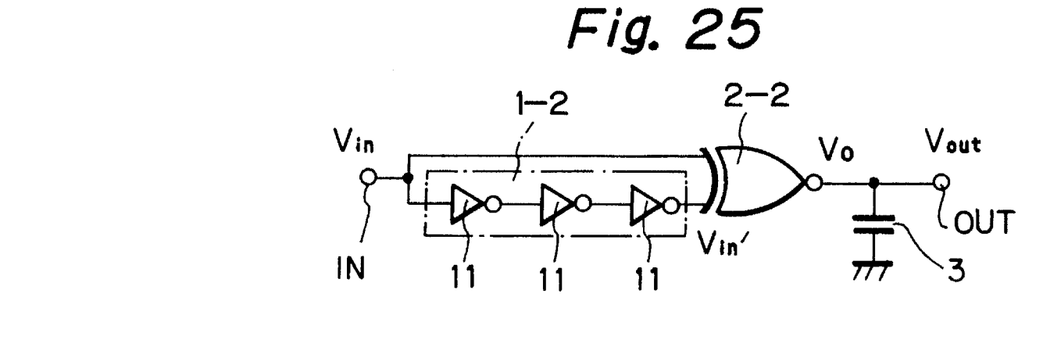
FIG. 25 is a detailed circuit diagram of a twelfth example of the apparatus of FIG. 2.

In FIG. 25, which illustrates a twelfth example of the circuit of FIG. 2, a logic circuit 2-6 is formed by an exclusive NOR circuit, which is different from the circuit of FIG. 21.

Figures 26A, 26B:
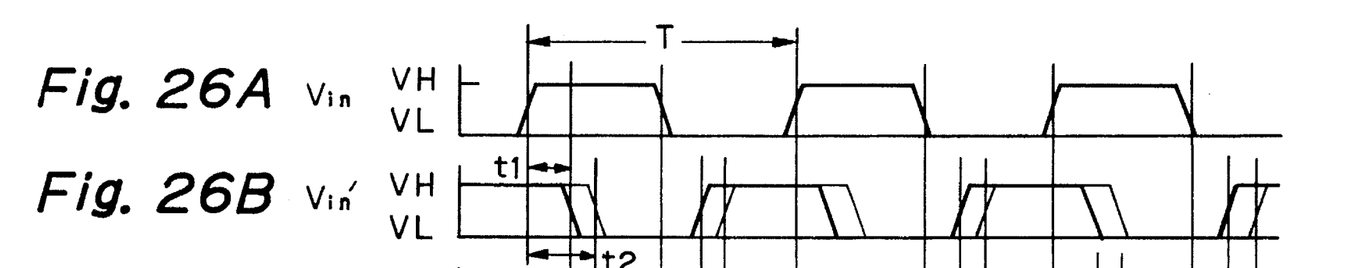
FIGS. 26A through 26D are timing diagrams for explaining the operation of the apparatus of FIG. 25.
Figures 26C, 26D:
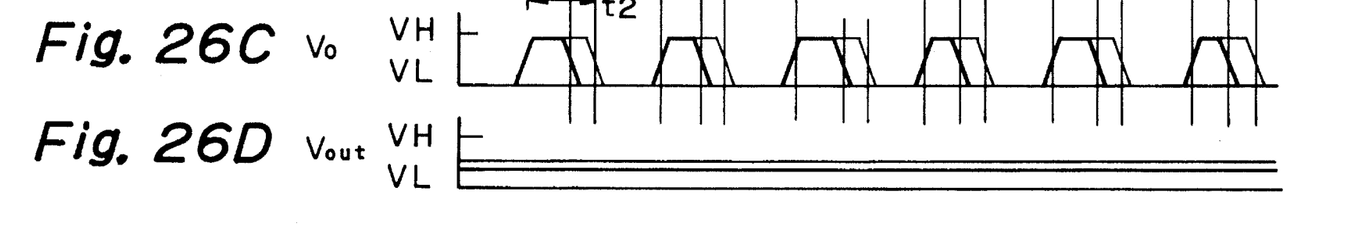

The operation of the apparatus of FIG. 25 is explained next with reference to FIGS. 26A through 26D. In this case, in the logic circuit 2-5, only when the signals $V_{in}$ and $V_{in}'$ as shown in FIGS. 26A and 26B are different from each other, is the output signal $V_o$ of the logic circuit 2-6 high as shown in FIG. 26C. Otherwise, the output signal $V_o$ is low. Therefore, a pulse width of the output signal $V_o$ under the condition that the integrator 3 is not provided depends upon the delay time of the series arrangement 1-2. For example, if the delay time is increased from t1 to t2, the pulse width of the output signal $V_o$ as shown in FIG. 26C is decreased. Here, assume that the time period of the input signal $V_{in}$ is T and a duty ratio of the input signal $V_{in}$ is 50%. Then, the pulse width of the output signal $V_o$ of FIG. 26C is $$t \qquad (23)$$

Therefore, when the output signal $V_o$ as shown in FIG. 26C is integrated by the integrator 3, the DC voltage output $V_{out}$ of the integrator 3 is $$VL+(VH-VL)\cdot 2t/T \qquad (24)$$

Thus, also in this case, the DC voltage output $V_{out}$ of the integrator 3 has a linear relationship to the delay time t of the series arrangement 1-2.

Figure 27:
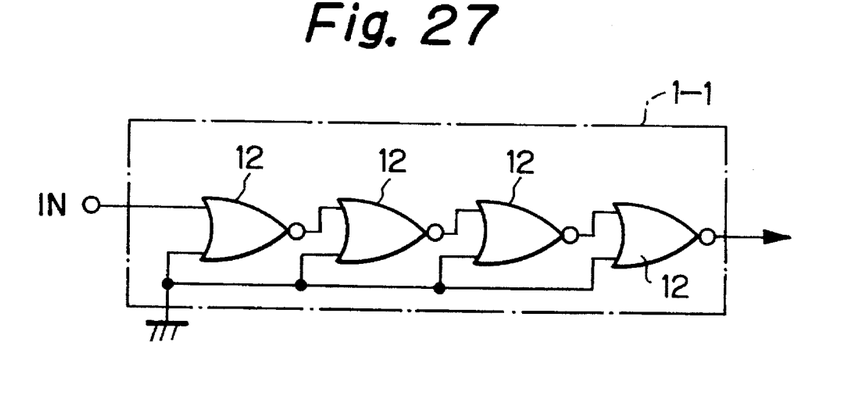
FIGS. 27, 28, 29 and 30 are circuit diagrams illustrating other examples of the series arrangement of FIG. 2.
Figure 28:
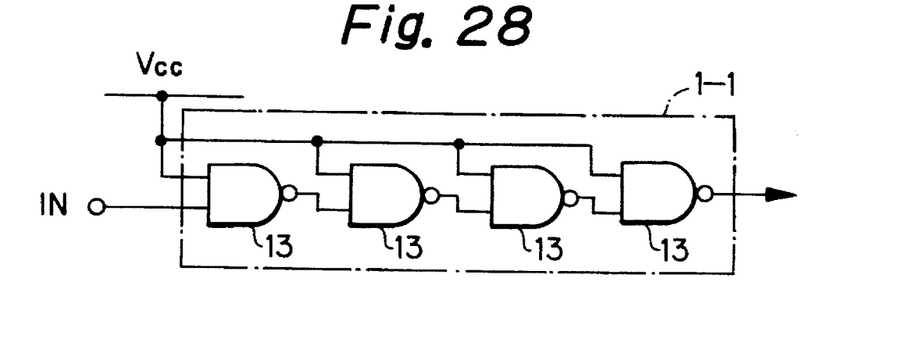

In FIGS. 3, 5, 11, 13, 19 and 21, although the series arrangement 1-1 is formed by four inverters, the series arrangement 1-1 can be formed by an even number of inverters other than four inverters. Also, the series arrangement 1-1 can be formed by an even number of NOR circuits 12 connected in series as illustrated in FIG. 27, or by an even number of NAND circuits 13 connected in series as illustrated in FIG. 28.

Figure 29:
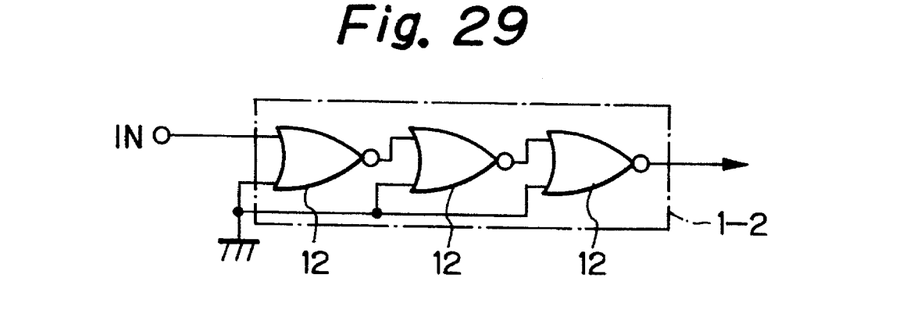
Figure 30:
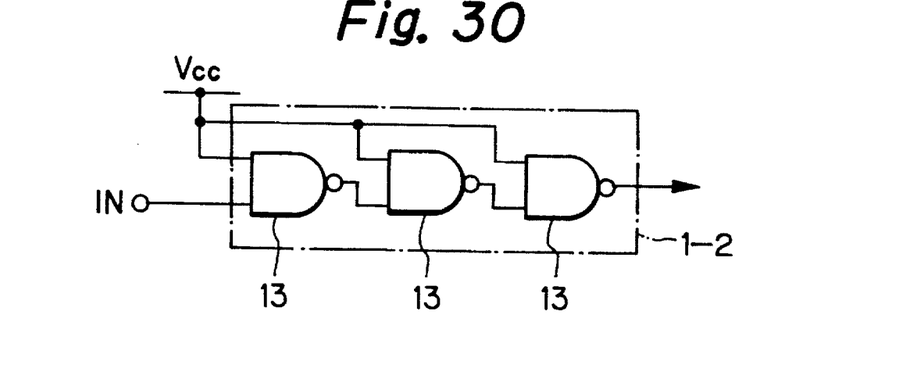

In FIGS. 7, 9, 15, 17, 23 and 25, although the series arrangement 1-2 is formed by three inverters, the series arrangement 1-2 can be formed by an odd number of inverters other than three inverters. Also, the series arrangement 1-2 can be formed by an odd number of NOR circuits 12 connected in series as illustrated in FIG. 29, or by an odd number of NAND circuits 13 connected in series as illustrated in FIG. 30.

As explained hereinbefore, according to the present invention, since the output of the integrator has a linear relationship to the delay time of the series arrangement of logic circuits, the fluctuations of switching speed of a digital integrated circuit can be directly detected.

We claim:

1. A switching speed fluctuation detecting apparatus comprising:

an input terminal for receiving a signal having a definite time period;

a series arrangement of at least one first logic circuit, said series arrangement having an input connected to said input terminal;

a second logic circuit having a first input connected to said input terminal and a second input connected to an output of said series arrangement; and an integrator connected to an output of said second logic circuit.

2. The apparatus as set forth in claim 1, wherein said first logic circuit comprises an inverter.

3. The apparatus as set forth in claim 1, wherein said first logic circuit comprises a NOR circuit.

4. The apparatus as set forth in claim 1, wherein said first logic circuit comprises a NAND circuit.

5. The apparatus as set forth in claim 1, wherein said second logic circuit comprises a NOR circuit.

6. The apparatus as set forth in claim 1, wherein said second logic circuit comprises an OR circuit.

7. The apparatus as set forth in claim 1, wherein said second logic circuit comprises a NAND circuit.

8. The apparatus as set forth in claim 1, wherein said second logic circuit comprises an AND circuit.

9. The apparatus as set forth in claim 1, wherein said second logic circuit comprises an exclusive NOR circuit.

10. The apparatus as set forth in claim 1, wherein said second logic circuit comprises an exclusive OR circuit.

* * * * *